United States Patent [19]

Gerrie et al.

[11] Patent Number: 5,097,390

[45] Date of Patent: Mar. 17, 1992

[54] PRINTED CIRCUIT AND FABRICATION OF SAME

[75] Inventors: Richard W. Gerrie, Bedford; Victor F. Dahlgren, Nashua, both of N.H.

[73] Assignee: Interflex Corporation, Manchester, N.H.

[21] Appl. No.: 209,826

[22] Filed: Jun. 22, 1988

Related U.S. Application Data

[63] Continuation of Ser. No. 940,479, Dec. 10, 1986, abandoned.

[51] Int. Cl.[5] .............................................. H05K 1/11
[52] U.S. Cl. ................................... 361/412; 174/255; 174/258; 174/261; 361/414
[58] Field of Search ...................... 174/68.5, 255, 258, 174/261; 361/398, 412, 414

[56] References Cited

U.S. PATENT DOCUMENTS

| | | | |
|---|---|---|---|
| 3,105,869 | 10/1963 | Branch et al. | 174/68.5 |
| 3,228,091 | 1/1966 | Rice et al. | 29/155.5 |
| 3,409,732 | 11/1968 | Dahlgren et al. | 361/414 X |
| 3,471,348 | 10/1969 | Shaheen et al. | 174/68.5 X |
| 3,772,776 | 11/1973 | Weisenburger | 174/117 PC |
| 3,851,382 | 12/1974 | Stork | 29/578 |
| 3,888,745 | 6/1975 | Hojyo | 204/18 R |
| 3,939,558 | 2/1976 | Riley | 174/525 X |
| 3,999,285 | 12/1976 | Lewis et al. | 29/588 |
| 4,026,011 | 5/1977 | Walton | 174/68.5 X |
| 4,037,047 | 7/1977 | Taylor | 174/68.5 |
| 4,063,993 | 12/1977 | Burns | 156/659 |
| 4,064,622 | 12/1977 | Morris et al. | 29/846 |
| 4,081,600 | 3/1978 | Kueneman et al. | 174/68.5 |
| 4,095,866 | 6/1978 | Merill | 361/414 X |
| 4,241,436 | 12/1980 | Bolzt et al. | 368/88 |
| 4,268,956 | 5/1981 | Parks et al. | 29/869 |
| 4,287,014 | 9/1981 | Gaku et al. | 156/306.9 |
| 4,296,457 | 10/1981 | Hahlganss | 361/413 |
| 4,316,320 | 2/1982 | Nogawa et al. | 29/839 |
| 4,331,740 | 5/1982 | Burns | 428/572 |
| 4,338,149 | 7/1982 | Quaschner | 156/248 |
| 4,343,083 | 8/1982 | Takemura et al. | 29/832 |
| 4,355,463 | 10/1982 | Burns | 29/827 |
| 4,402,131 | 9/1983 | Roberts | 29/847 |
| 4,420,364 | 12/1983 | Nukii et al. | 156/631 |
| 4,495,546 | 1/1985 | Nakamura et al. | 361/398 |
| 4,509,095 | 4/1985 | Boros | 361/386 |
| 4,532,575 | 7/1985 | Suwa | 361/413 |
| 4,533,787 | 8/1985 | Anderegg et al. | 174/68.5 |
| 4,550,357 | 10/1985 | Matsumoto | 361/398 |
| 4,626,462 | 12/1986 | Kober et al. | 428/137 |
| 4,664,962 | 5/1987 | DesMarais, Jr. | 428/137 |
| 4,668,332 | 5/1987 | Ohnuki et al. | 156/630 |
| 4,677,529 | 6/1987 | Watanabe et al. | |
| 4,687,695 | 8/1987 | Hamby | 174/68.5 |
| 4,710,854 | 12/1987 | Yamada et al. | 361/414 |
| 4,715,928 | 12/1987 | Hamby | 156/630 |
| 4,756,940 | 7/1988 | Payne et al. | 361/398 X |
| 4,800,461 | 1/1989 | Dixon et al. | 361/398 |

FOREIGN PATENT DOCUMENTS

| | | |
|---|---|---|
| 569778 | 7/1954 | Japan . |
| 50-158877 | 12/1975 | Japan . |
| 60-85873 | 6/1985 | Japan . |
| 61-97877 | 6/1986 | Japan . |

OTHER PUBLICATIONS

Ardito et al., *Making Integral Multilayer Circuit Boards with Cable Connection*, IBM Tech. Bull., V. 14, #3, Aug. 1971, pp. 701 and 702.

Kapton ® *Polyimide Film: Summary of Properties* (Du Pont Company, Wilmington, Del., 1983).

*Primary Examiner*—Morris H. Nimmo
*Attorney, Agent, or Firm*—Perman & Green

[57] ABSTRACT

Apparatus and method for protecting intermediate layers of a multi-layer printed circuit board from chemical or other damage from processing of a layer or layers to which previously fabricated layers of the printed circuit board are attached prior to such additional processing. A thin layer of protective material is selectively attached to intermediate or inner layers of a multi-layer printed circuit board after fabrication of such layers, when the outer or subsequent layers are attached. Inner or intermediate layer(s) of a multi-layer printed circuit board are fabricated. When outer layer(s) of the resulting printed circuit board are attached to the inner or intermediate layer(s), a layer of protective material such as a thin sheet of chemical-resistive plastic is disposed between the inner or intermediate layer(s) and the outer layer(s) and is selectively or completely attached or bonded thereto such as with a layer of acrylic adhesive.

36 Claims, 7 Drawing Sheets

PRIOR ART

PRINTED CIRCUIT AND FABRICATION OF SAME

CROSS-REFERENCE TO RELATED APPLICATION

This is a continuation of application Ser. No. 940,479, filed Dec. 10, 1986, now abandoned.

BACKGROUND OF THE INVENTION

The present invention relates to printed circuits and their fabrication, and more particularly to multi-layer printed circuits and their fabrication.

Multi-layer or multiple layer printed circuits are made up of a number of layers of printed circuit boards or sheets which are attached by lamination, adhesive such as acrylic adhesive, or other appropriate means. Both surfaces of each of the printed circuit boards included in the multi-layer printed circuit usually have printed circuitry on same. Printed circuitry on one layer can be electrically connected to printed circuitry of another layer via a plated-through hole, which is a hole drilled through all layers to be so interconnected or more layers which hole then has metal applied to its interior surface so that an electrical connection between circuitry of different layers is thereby produced. Since registration or correlation of features of each of the layers to be bonded is important, often datum holes are provided to accomplish or more readily permit such registration.

Such printed circuit boards included in such multiple layers can be flexible or rigid. For example, a printed circuit can include layers which are flexible and layers which are more rigid. Multi-layer printed circuits, with flexible layer(s) and more rigid layer(s), can be produced having portions which are flexible and portions which are more rigid, when selected portions of the more rigid layer or layers are removed to expose the flexible portion or portions.

It is often advantageous in processing of a printed circuit board to produce printed circuit boards using layers of standard length and width. Where such standard sizes are larger than the resulting manufactured finished printed circuit boards, more than one such printed circuit board can be produced at a time, by performing appropriate layout of the printed circuit boards thereon such that each finished printed circuit occupies a different, separate portion of such a standard-sized sheet.

Printed circuits can be fabricated wherein conductive paths on outer layer(s) are fabricated after such layer(s) are bonded to or attached to the inner or intermediate layer or layers. Such conductive paths on these or other layer(s) can be formed by plating such paths onto a bare substrate, or by etching a metal-clad substrate to remove all but the desired metallization. In either case, the multi-layer composite is thus subjected to chemicals and other stresses that could be injurious to the conductive paths, etc. on the inner or intermediate layers. Those concerned with the fabrication of multiple layer printed circuit devices have long recognized the need for protection from such hazards. The present invention fulfills this need.

Conventional pre-cut panels often become contaminated with processing fluids during such subsequent processing, resulting in undesirable circuit board yields.

The open or pre-cut panel also presents difficult lamination problems to the circuit manufacturer.

It is accordingly desirable to keep plating solution and etching solutions out of areas of circuit panels where their presence would mean entrapment of these fluids within the circuit panel structure, leading to subsequent corrosion or reduced electrical insulation within the circuit itself.

Where a partially flexible and partially more rigid multi-layer printed circuit is to be produced, an opening or window is often cut into the outer, more rigid layers along portions of the future boundary between the flexible and more rigid portions of the finished printed circuit. Such openings can be cut before or after bonding of the outer layer or layers to the rest of the multi-layer structure. In order to reduce or control damage to the inner or intermediate layer or layers while metallization paths are fabricated by plating or etching on such outer layer or layers, after bonding such opening(s) are substantially filled with an adhesive-coated Teflon fiberglass filler. In the field of multi-layer printed circuit fabrication, it has been the general practice to employ adhesive-coated Teflon fiberglass, each piece stamped to match the corresponding opening as a tight fit, for protection of the underlying circuitry, thereby exposed, from such hazards during subsequent fabrication. The pressure-sensitive adhesive on each such filler faces the corresponding surface of the flexible layer, and holds it in place during fabrication. Although such formed materials have served the purpose, they have not proved entirely satisfactory under all conditions of service for the reason that considerable difficulty has been experienced in effectiveness of such sealing. Also, the adhesive on the filler also can contaminate the flexible layer(s), and can rip the flexible layer(s) or metallization thereon when the filler is removed. Also, different openings require production of differently shaped fillers. In addition, different device requirements may involve different thicknesses of hardboard, which requires stocking of different thicknesses of Teflon sheets for such fillers.

Furthermore, the boundary between the flexible and more rigid portions of such a multi-layer printed circuit, being a mechanical interface, is a location of stress. Such stress can cause tearing of the flexible portion of the printed circuit, breaking of conductive paths at the boundary, or initial delamination of the outer layer or layers. A liquid epoxy or urethane plastic bead applied at such boundary been employed to make the transition from flexible to more rigid portions more gradual, and thereby provide strain relief. However, application and during of the resin for such beads requires additional fabricating steps.

The liquid plastic bead is difficult to apply, difficult to control in dimensions, takes time to cure, and is difficult to store, and so is expensive to use.

In the flexrigid circuit construction, the sharp line formed by contour change between rigidizer board and flex cable becomes a point of stress to induce possible tearing of the flex or cracking conductors. To preclude possible failure in this mode, the usual solution is to apply a liquid epoxy or urethane plastic bead at the facial intersection and then cure the resin in place. The resin then acts as the strain relief.

In producing multi-layer printed circuits with both flexible and more rigid portions, one practice has been to make up the flexible layers of circuitry first. One such material for a flexible substrate is KAPTON polyimide material. Accordingly, it is desirable to eliminate the need for the careful insertion and removal of such filler pieces. As soon as the flexible layers are processed and cover-coated, the outer layers which will act as the stiffener portion or the component mounting portion are also processed, e.g. conductive paths defined and slots routed. The first step in the outer layers is to put in the datums of the panels, print and etch only the inner layers of the panels, and then proceed to provide cutouts in the panels w-here the portion of flexible circuitry is to show through the flex rigid structure. The rigid panels are cut along the future boundaries between flexible and more rigid portions of the finished product. The double-clad flexible layer in the center, the appropriate acrylic adhesive and the outer stiffener layers which have been provided with openings or windows are laid up in a laminating fixture by being placed over the datum pins. The flexible area exposed portions are then filled by inserting stamped Teflon fiberglass fillers which have been precoated on one side with an adhesive. These fillers are put into the panel in the open areas as an attempt to seal the panel from the subsequent wet processing. The flexible, interior portion of such a printed circuit device, with the conductive paths and other features already fabricated thereon, are then bonded to the more rigid, outer layer or layers using sheets of acrylic adhesive. The composite is then laminated together under heat and pressure, wherein the acrylic adhesive is cured adhering the stiff members to the flexible portions and creating a panel which has a variety of openings in it where the flexible layers show through. After lamination, the panel is then drilled, plasma processed to produce via or interconnect holes, plated at via holes, unplated holes plugged/and subjected to the print and etch procedures common to printed circuit practices to produce conductive paths and other features, to produce the exterior circuit portions on the stiff members. Holes that do not require plating and if drilled at the same time as all the other holes, must be plugged such as with a rubber or Teflon pin. Otherwise, such holes must be subsequently drilled, as secondary holes, after the etching is completed. After the panels are thus processed, the filler portions are very carefully extracted from the panel assembly because the flexible areas have a tendency to rip easily, so care has to be taken in removing the fillers from such areas. The fillers are therefore carefully removed to minimize or reduce damage or to attempt to prevent damage to the underlying flexible conductive paths and substrate(s). The panels are then taken to a router which uses the panel datums as reference points and routs or cuts out the hardboard section, with considerable care taken in the now flexible areas not to tear the flexible substrate. The printed circuit devices are then cut out of the bonded or laminated sheets or panels.

There is shown in FIG. 1 a prior art multi-layer printed circuit construction including a flexible printed circuit layer 10. Flexible printed circuit 10 includes a flexible substrate 12 such as of polyimide sold under the trademark "KAPTON" by Du Pont Company. KAPTON plastic is produced by a polycondensation reaction between an aromatic terabasic acid or an aromatic dianhydride, and an aromatic diamine. Each surface of substrate 12 bears respective appropriate metallic (such as copper) interconnections, conductive paths and/or features 15, 17. Substrate 12, and metallization 15 and 17, are encapsulated between two flexible layers 11 and 13 such as of adhesive-backed Kapton. Flexible layers 11 and 13 can for example each be of Kapton plastic, Metallization 15 and 17 disposed on respective surfaces of flexible substrate 12 can for example be of copper, and can each be formed by plating or deposition on a bare substrate, or by etching an already metal-clad substrate, utilizing photolithography. Layers 11, 12 and 13 are bonded together such as by lamination using adhesive. Disposed on either side of the flexible printed circuit 10 are fiberglass printed circuit boards 19 and 21, which act as stiffeners. Disposed on either side of rigid printed circuit board 19 are metallic (such as copper) interconnections, conductive paths and/or other features 23. Disposed on either side of rigid printed circuit board 21 are metallic interconnections, conductive paths and/or other features 25. Stiffeners 19 and 21 can for example be of fiberglass. Metallization 23 and 25 can for example be of copper, and can be respectively formed on stiffeners 19 and 21 by plating, or etching, with photolithography in substantially the same manner that metallization 15 and metallization 17 were formed. Disposed between flexible layer 11 and stiffener 19 is a bonding layer 27 such as of acrylic adhesive. Disposed between flexible layer 13 and stiffener 21 is bonding layer 29. Layers 27 and 29 can for example each be of acrylic adhesive. When the configuration of FIG. 1 is subjected to heat and pressure to cure bonding layers 27 and 29, stiffener 19 is thereby bonded to flexible layer 11, and stiffener 21 is thereby bonded to flexible layer 13.

There is shown in FIG. 2 a prior art printed circuit 31 including flexible portions 33 and more rigid portions 35. Portions 35 are of the construction of FIG. 1. In producing a printed circuit 31 having flexible portions 33 as well as more rigid portions 35, a single sheet of hardboard is utilized as stiffener 19 for one side of all portions 35, and another, single sheet of hardboard is utilized to produce stiffener 21 for the other surface of all regions 35. In order to prevent bonding of such boards to flexible layers 11 and 13 in portions 33, the board sheets are cut away in such areas. However, following bonding of layer 19 to layer 11 and of layer 21 to layer 13, it may be desirable to thereafter form metallization 23, 25 on the exterior of more rigid portions 35. Accordingly, it has been a general practice to fill in such cutouts with an appropriately shaped Teflon insert or filler which is disposed in each such cutout on each side of flexible layers 11 and 13 at portions 33. Such inserts must be separately shaped and inserted for each flexible area 33. Some shapes may be difficult to form or reproduce. Movement of an insert during fabrication of printed circuit 31 can result in faults or defects in device 31. The surface of each insert contacting a flexible layer 11, 13 bears pressure-sensitive adhesive to limit such movement. While during fabrication the various sheets that ultimately become layers 11, 13, 19, 21, 27 and 29 can and generally do extend beyond the edges of the piece being produced and can be registered to datum points (not shown) having corresponding positions on each such sheet, no such registration can be provided for the inserts. Also, leaks can occur between hardboard 19, 21 and the inserts, permitting the chemicals used in processing metallization 23 and 25 to enter the interior of future device 31 at the openings or cutouts. After the fillers are removed, and device 31 is cut out, a bead 37 of curable liquid epoxy or urethane is applied to each boundary of flexible 33 and more rigid 35 portions. The liquid epoxy or urethane is then cured to form bead lines 37. Bead lines 37 provide strain relief at the boundary between flexible portions 33 and rigid portions 35. However, bead lines 37 require additional steps for application and cure.

SUMMARY OF THE INVENTION

Accordingly, it is the general purpose of the invention to provide multiple-layer printed circuits, and apparatus and method for fabrication of multiple-layer printed circuits.

Other objects of the present invention are to provide apparatus and method which substantially reduces or eliminates chemical or other contamination or damage to already-fabricated portions of a multiple layer printed circuit being fabricated, which is relatively easily performed, which provides stress relief at the intersection between flexible and more rigid portions of a finished printed circuit device, which reduces complexity of fabrication of such devices, and which reduces fabrication costs.

Briefly, these and other objects are accomplished by incorporating a protective layer between internal or interior layer or layers on which conductive paths and/or other features have been fabricated, and outer layer or layers to which such interior or internal layer or layers are to be bonded. The protective layer should be incorporated on both sides of the group or set of such partially fabricated interior or internal layer or layers. The protective material can for example be a thin sheet, such as of chemical-resistant plastic such as KAPTON polyimide. The protective material can be repeatedly included, such as when a series of layers are to be added sequentially to an inner or interior layer or layers, in which case such a protective material can be added between interior and newly added intermediate or exterior layer or layers each time that the latter are added. Since the protective material is preferably a continuous sheet, there is no need for addition of a protective insert, as any slits or routs in an exterior or more external intermediate layer are internally covered by such material wherever such slits or routs may appear. The plastic material can be included by lamination, by adhesive, by bonding, or by any suitable means. Adhesive or bonding could be placed along the entire facing surface of a layer facing such protective material, or only in places along such surface, as desired.

Where a printed circuit having both flexible and more rigid portions is to be produced or is being produced, the protective material can be applied between the flexible and more rigid layers during manufacture, with the protective material being bonded to the entire surface of the rigid layer that it faces, but being bonded to the flexible layer only other than in areas where the flexible layer or layers are to be exposed to provide a flexible portion of the finished device.

After formation of metallization, soldering, and other fabrication steps are completed, and the finished product is cut out, where the protective material was bonded to the more rigid layer but not to the flexible layer, the protective/more rigid composite can then be readily peeled from the flexible layer or layers to leave a flexible portion of the finished printed circuit. If desired, a small portion of the protective material can be left from the more rigid/protective composite, extending from the boundary between the flexible and more rigid portions of the finished printed circuit board, to provide strain relief at such boundary.

Other objects, advantages and novel features of the invention will become apparent from the following detailed description of the invention when considered in conjunction with the accompanying drawings wherein:

DESCRIPTION OF THE PREFERRED EMBODIMENT

Figure 1:
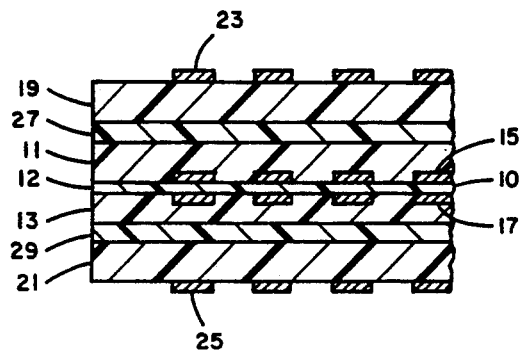
FIG. 1 is a sectional view of a prior art multiple layer printed circuit device in one stage of fabrication.
Figure 3:
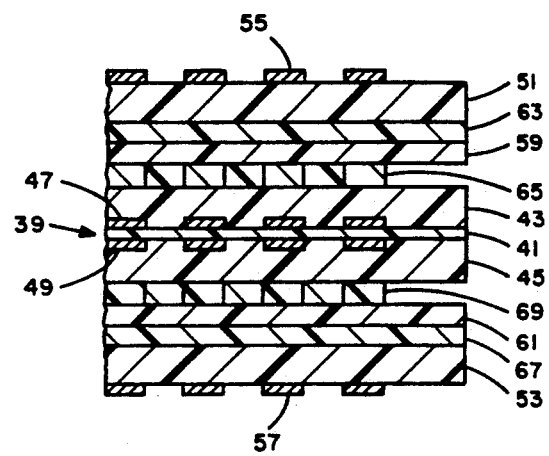
FIG. 3 is a sectional view of a portion of a multi-layer printed circuit according to the present invention.

Referring now to the drawings, wherein like reference characters designate like or corresponding parts throughout the several views, there is shown in FIG. 3.

There is shown in FIG. 3 a portion or cross-section of a printed circuit according to the present invention including flexible printed circuit layer 39. Flexible printed circuit 39 includes a flexible substrate 41 such as of Kapton material. Substrate 41 bears, on each major surface, respective metallization 47 and 49, such as of copper. One major surface of flexible substrate 41 bears metallization 47 such as of copper. The other major surface of flexible substrate 41 bears metallization 49 such as of copper. Metallization 47 and 49 can be formed such as with photolithography by etching a metal-clad substrate or by plating or deposition on a bare substrate. Flexible encapsulation layers 43 and 45 (such as of adhesive-backed Kapton) are bonded to opposite sides of layer 41. Disposed opposite the exposed surface of flexible layer 43 is printed circuit board 51, which acts as a stiffener. Disposed opposite the exposed surface of flexible layer 45 is printed circuit board 53, which also acts as a stiffener. Disposed on either or both surfaces of board 51 is metallization 55. Disposed on either or both surfaces of board 53 is metallization 57. Metallization 55 and 57 can be formed by photolithography by etching a metal-clad board or by deposition on or plating a bare board. Metallization 55 and 57 can for example be of copper. Stiffener 51 and stiffener 53 can for example each be of fiberglass. Disposed between stiffener 51 and flexible layer 43 is a layer 59 of protective material that can prevent or tends to resist bonding to flexible layer 43. This flexible material 59 can for example be a thin plastic sheet such as of Kapton plastic. Disposed between flexible layer 45 and stiffener 53 is a layer 61 similar to layer 59. Disposed between layer 59 and layer 51 is a bonding layer 63 such as a layer of acrylic adhesive for bonding layer 59 to layer 51. Layer 63 is preferably of a heat-curable adhesive such as an acrylic adhesive. Layer 63 can be added as a separate layer, or can initially be bonded or attached to layer 59. Disposed between protective layer 59 and flexible layer 43 is a layer 65 which provides for selective adhesion between protective layer 59 and flexible layer 43. For example, layer 65 can be a layer of adhesive, such as acrylic adhesive, that has been stamped or cut to remove areas where no adhesion between flexible layer 43 and protective layer 59 is needed, such as areas where layer 51 and layer 43 are not to be bonded or physically connected. Examples of such areas are areas where the finished device is to be flexible. Disposed between layer 53 and layer 61 is a bonding layer 67 such as a layer of acrylic adhesive for bonding layer 53 to layer 61. Layer 67 is preferably of a heat-curable adhesive such as an acrylic adhesive. Layer 67 can be added as a separate layer, or can initially be bonded or attached to layer 61. Disposed between protective layer 61 and flexible layer 45 is a layer 69 which provides for selective adhesion between protective layer 61 and flexible layer 45. For example, layer 69 can be a layer of adhesive, such as acrylic adhesive, that has been stamped or cut to remove areas where no adhesion between flexible layer 45 and protective layer 61 is needed, such as areas where layer 53 and layer 45 are not to be bonded or connected. Examples of such areas are areas where the finished device is to be flexible.

Figure 4:
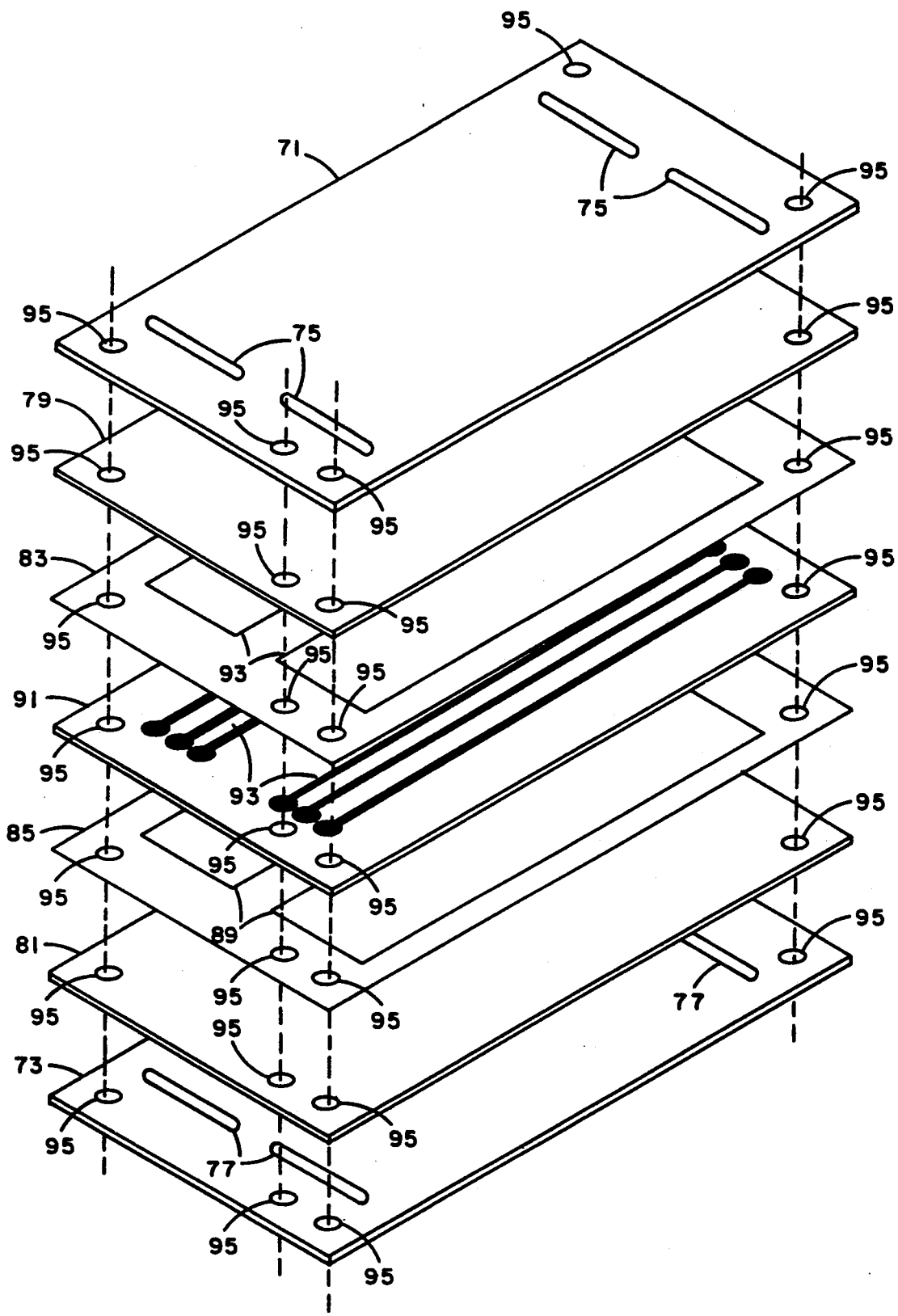
FIG. 4 illustrates relative arrangement of various layers of what is to be one or more printed circuit(s) according to the present invention and aligned before combination or bonding of such layers.

By eliminating the need for inserts, printed circuit 42 of FIG. 3 can be constructed from a series of sheets of substantially the same size that are larger than printed circuit 42 and that are provided with corresponding features along their edges that can be lined up for better registration of each layer with the others This advantage is shown in FIG. 4. In FIG. 4, each layer is a sheet of appropriate material having appropriate features of the future finished device 42 defined or provided therein. Such features should be lined up with other features on other layers in order to produce a proper device. In FIG. 4, layers 71 and 73, the outermost layers, are each a sheet of routed, 75 or 77, respectively, rigid material such as fiberglass. Sheet 71 has routs, or slots or narrow openings, 75 cut therein. Rigid sheet 73 has routs 77 cut therein. The next innermost layers, sheets 79 and 81 of sealed panel material, are each of protective material such as KAPTON polyimide backed on the outer surface with acrylic adhesive. The next innermost layers or sheets, sheets 83 and 85 of pre-cut adhesive such as acrylic adhesive, each have cutouts 87 or 89 for windows therein, where sheets 71 and 73 are respectively not to be bonded to innermost, layer 91 to leave a flexible or exposed portion of the finished printed circuit device. Layer 83 is provided with one or more cutouts or windows 87 in areas where sheet 71 is not to be bonded to flexible innermost layer 91. Sheet 85 is provided with cutouts or windows 89 in areas where sheet 73 is not to be bonded via sheets 81 and 85 to innermost layer 91. Flex circuit profile 91 is the innermost layer of the assembly of FIG. 4, and is provided with metallization 93 on its surfaces. Openings 75, 77, 87 and 89, and metallization 93, must all be aligned each with the other in order to produce a proper finished device. Since the outer edges of layer 71, 79, 83, 91, 85, 81 and 73 are all of substantially the same size, and since the edges of those layers correspond, such alignment can be more readily provided by the inclusion, use and registration of datum holes 95 with which all layers are provided for alignment and registration. Accordingly, in fabrication of a printed circuit according to the present invention, there is no need for inserts, so that all layers can be aligned at their edges such as with datum points 95 making proper alignment of corresponding features on different layers easier to accomplish.

Figure 5:
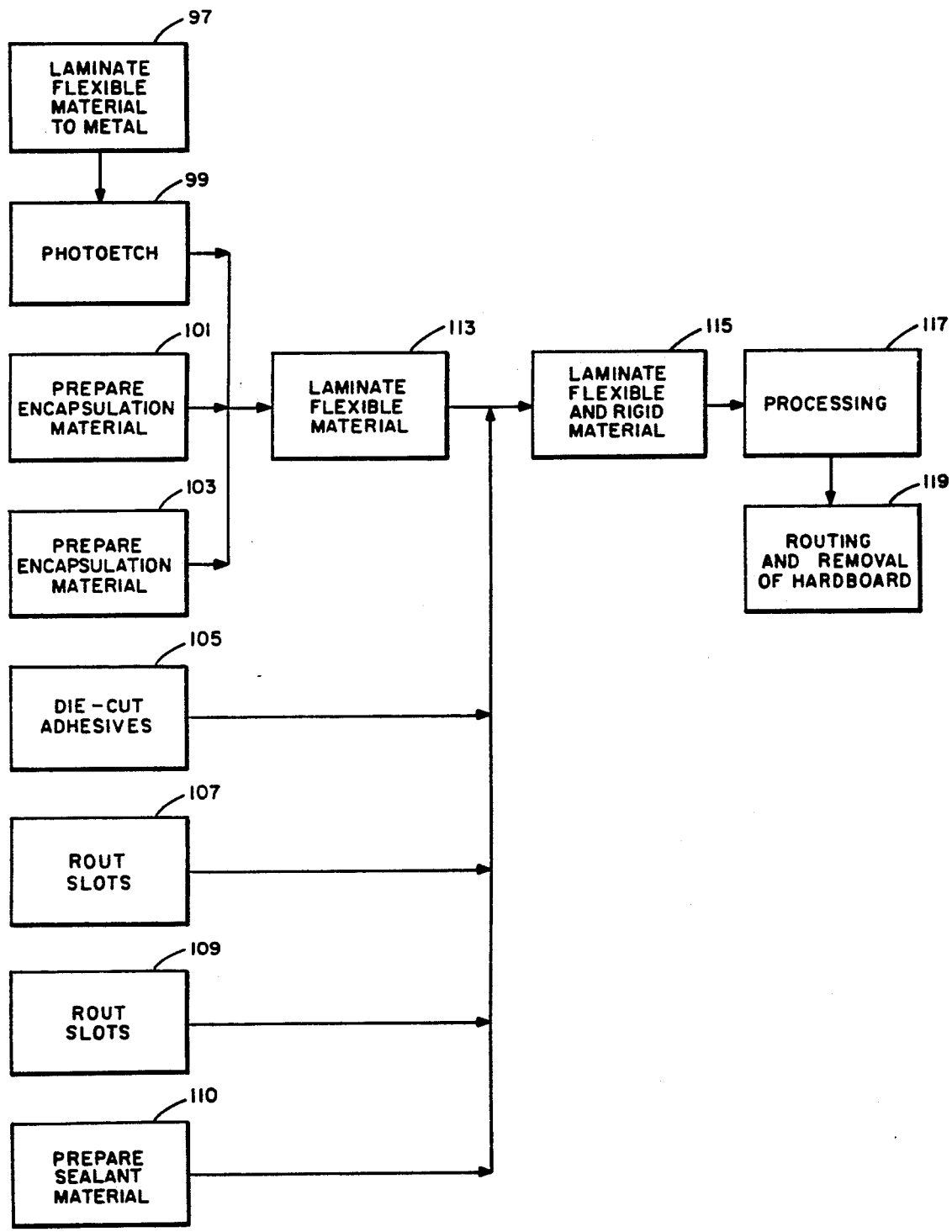
FIG. 5 is a diagrammatic representation of the method of fabrication of one or more printed circuits according to the present invention.

The steps of a process according to the present invention are shown in FIG. 5. Although steps 97, 101, 103, 105, 107, 109 and 111 can be practiced in any order, such as sequentially or in parallel or simultaneously, step 99 must follow step 97, and step 113 can only occur after steps 97, 99, 101 and 103 have occurred. Also, step 115 can occur only after steps 113, 105, 107, 109 and 111 have been completed. Accordingly, it is preferred to perform steps 97, 99, 101, 103, 105, 107, 109, and 111 in that order sequentially, to perform step 113 as soon as steps 97, 99, 101 and 103 have been completed (such as during step 105), and then to perform step 115 after steps 113, 105, 107, 109 and 111 have been completed. The individual steps of FIG. 5 can be considered with reference to FIG. 6.

Figure 6:
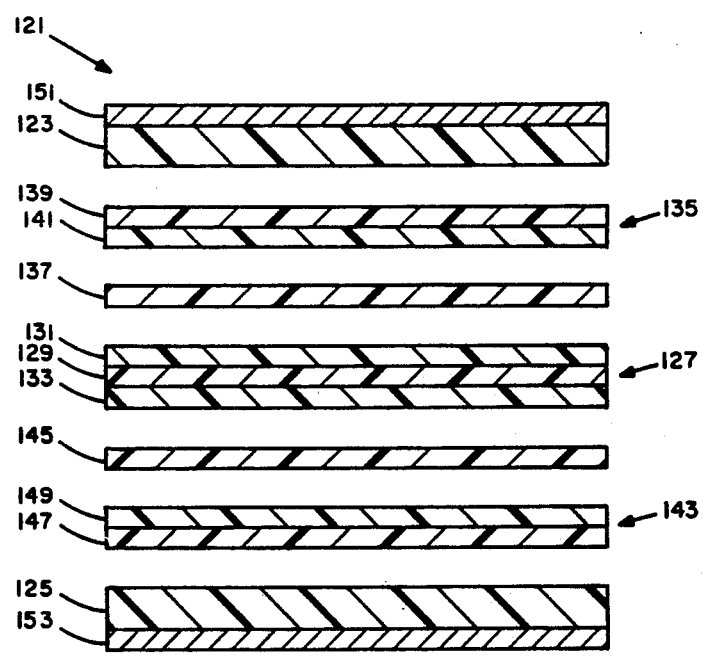
FIG. 6 is an end view of the arrangement of material at one step of the process of FIG. 5.
Figure 2:
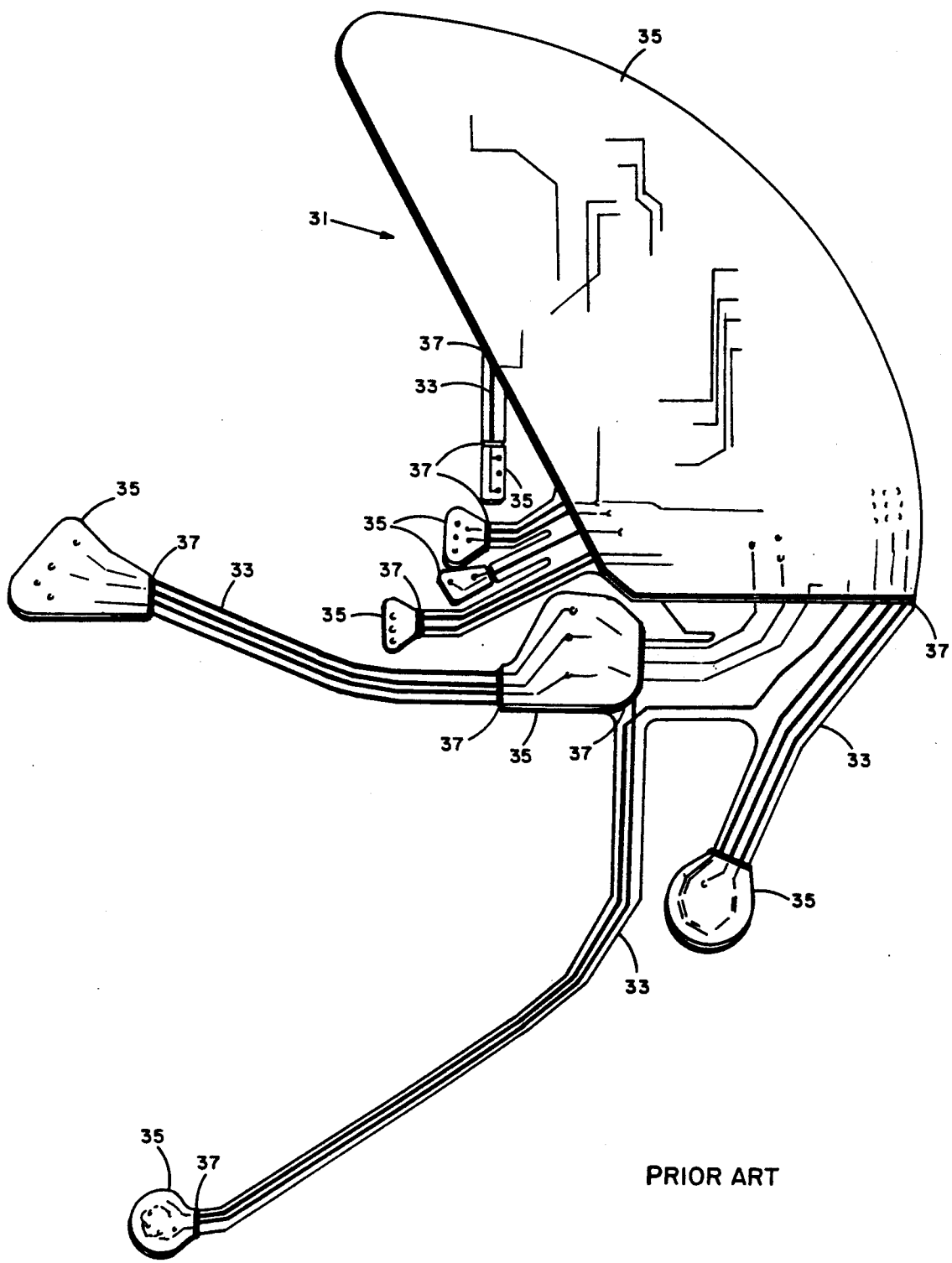
FIG. 2 illustrates a prior art printed circuit constructed as in FIG. 1.

In step 97 of FIG. 5, flexible material such as Kapton is bonded to metal such as rolled annealed copper in panel form. In step 99, datum holes are drilled in the resulting metal-clad flexible material, and conduction paths and any other desired metallic features are formed from such cladding by photolithography, using photoresist, and then etching the metallic cladding. Steps 97 and 99 are performed on two or any desired number of flexible layers. In covercoat step 101 a sheet of flexible material such as KAPTON polyimide, coated with adhesive such as acrylic adhesive is provided with datum holes such as by punching. In covercoat step 103, another sheet of flexible material such as KAPTON polyimide coated with adhesive such as acrylic adhesive, is provided with datum holes such as by punching. In step 105, two sheets of adhesive, such as acrylic adhesive, in the standard panel size are each provided with datum holes such as by punching, and is die cut to permit nonlaminated areas in the resulting panel. In step 107, a sheet of hardboard, such as of fiberglass clad with metal (such as copper) on one side (or both sides) is drilled to provide datum holes, and has slots or narrow openings cut or routed therein at or near what are to be boundaries between flexible and more rigid portions of the finished multilayer printed circuit. Such slots are also located at or near corresponding locations of some edges of die-cut areas of step 105. In step 109, the procedure of step 107 is repeated for another sheet of metal-clad hardboard. In step 111, a sheet of flexible material such as KAPTON polyimide, coated on one surface such as with acrylic adhesive, is provided with datum holes. In step 113, the layer of step 99 is laminated between the layer of step 101 and the layer of step 103. In step 115, a-laminate is formed of the laminate of step 113 sandwiched between the two die-cut adhesive layers of step 105, all of which layers are located between the hardboard layers of steps 107 and 109, with each layer of step 111 placed between a die-cut layer of step 105 and a hardboard layer of step 107 and of step 109. Step 117 involves production of all metallization features on the exterior, drilling, and plasma processing. In step 119, the finished printed circuit is cut out such as by a router from the laminate panel. FIG. 6 illustrates the arrangement of layers for a printed circuit 155 produced by the method of FIG. 5. FIG. 6 shows the arrangement of layers for the work makeup 121 in step 115 of FIG. 5. As shown in FIG. 6, work makeup 121 includes outermost layers 123 and 125 each of more rigid material such as hardboard such as of fiberglass, inner flexible printed circuit 127, protective layer 135 and die-cut adhesive layer 137 disposed between layers 123 and 127, and protective layer 143 and die-cut adhesive layer 145 disposed between layers 125 and 127. Flexible printed circuit or printed circuit layer 127 includes a flexible substrate 129 (such as of KAPTON polyimide) bearing metallization (not shown in FIG. 6). Bonded, one on each side, to substrate 129 are flexible layers 131 and 133, such as of KAPTON polyimide backed with curable adhesive for lamination (in step 113) to substrate 129. An encapsulation layer is not needed for any surface of substrate 129 not bearing metallization. Protective layer 135 includes a layer or sheet of protective material 141 of limited chemical permeability (such as KAPTON polyimide) backed with a layer of adhesive 139 (such as acrylic adhesive). Protective layer 143 includes a layer or sheet of protective material 149 of limited chemical permeability (such as KAPTON polyimide) backed with a layer of adhesive 147 (such as acrylic adhesive). Layer 123 is clad with metal 151 such as copper on its outermost surface. Layer 125 is clad with metal 153 such as copper on its exterior surface also. Protective layers 141 and 149 are preferably each of a sheet of 0.001 inch thick KAPTON polyimide backed or coated on one surface with a layer of 0.002 inch thick adhesive such as acrylic adhesive on its outward facing surface. Layers 123 and 125 are provided with slots 161 (FIGS. 7 and 8) partially about areas that are to be flexible. Adhesive layers 137 and 145 can for example each be of 0.002 inch thick acrylic adhesive that has been die-cut to leave openings in appropriate areas where bonding between layers 123 and 131, and between layers 125 and 133, would be undesirable. Adhesive layers 137 and 145 are preferably cut so that uncut adhesive of such layers would extend underneath slots 161 when work 121 is assembled.

Work 121 is aligned such as with datums 95 as in FIG. 4. The lamination of rigid and flexible portions of step 115 preferably takes place at 450 psi on the work at 365 degrees Fahrenheit for one hour thirty minutes. Layers 123, 135, 137, 127, 145, 143 and 125 should each be provided with datum holes to facilitate registration of all layers for proper alignment of all layers by registration of the datum holes, and accommodate appropriately shaped datum pins to maintain such alignment during the lamination of step 115.

Figure 7:
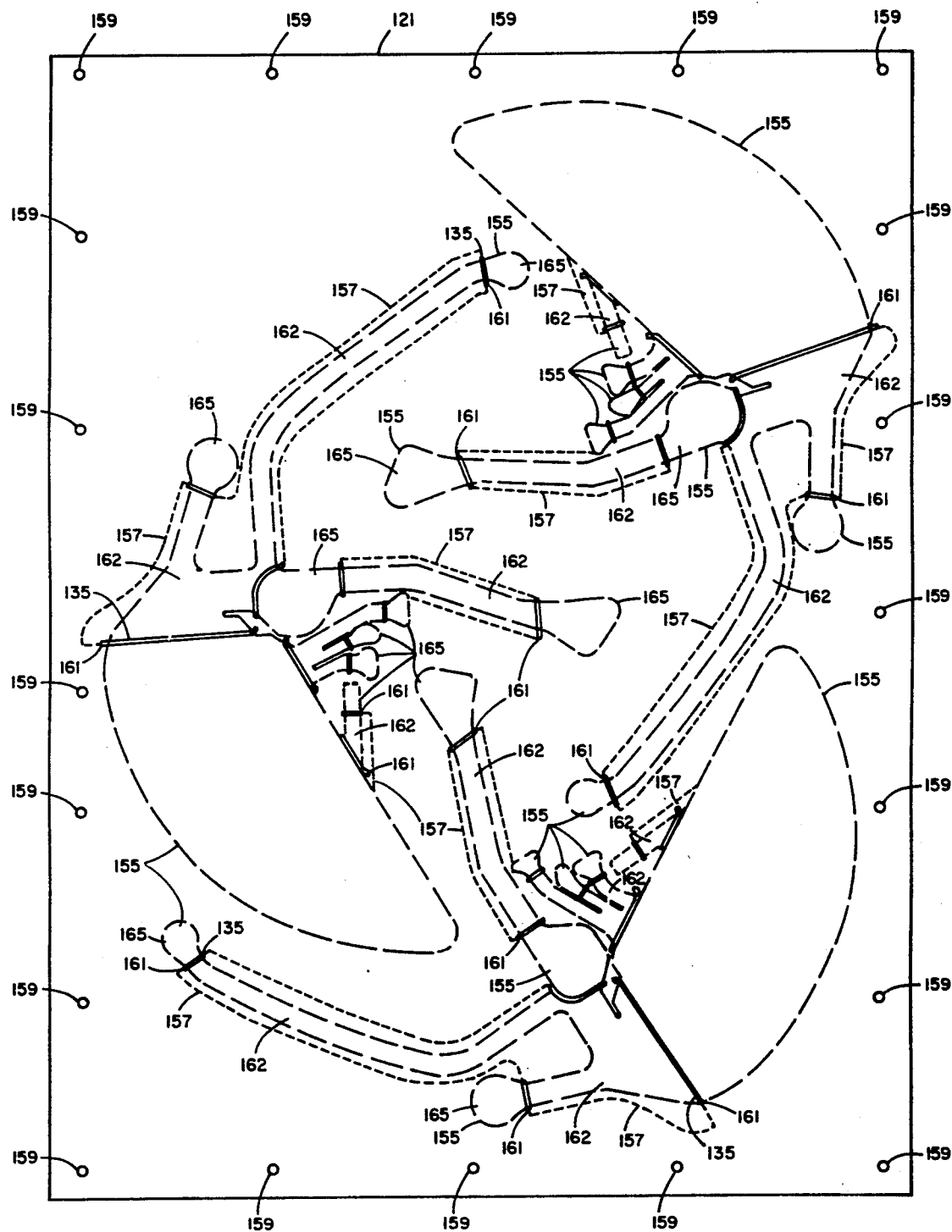
FIG. 7 illustrates printed circuit devices according to the present invention at one step of fabrication of the method of FIG. 5.

Work 121 following step 115 is shown in FIG. 7. A number of future finished devices 155 are shown thereon. Bonding of layers 123 and 125 to layer 127, respectively, does not occur in areas 157 where openings were cut in adhesive layers 137 and 145. As in FIG. 4, all layers of work makeup 121 are of substantially the same size and so are provided with datum holes for registration and alignment. Slots 161 are placed at edges of nonlaminated areas 157 or at boundaries between what are to be more flexible 163 and more rigid 165 portions of finished resulting device 155. Layer 135, not layer 127, is exposed at slots 161. After lamination step 115 and processing step 117, devices 118 can be cut out (step 119) such as with a router. Thereafter, the portions 162 of layers 121 and 123 that are not laminated to respective layers 131 and 133 can then be peeled away to leave flexible portions 163 of each device 118. The outlines of devices 155 are shown by broken lines in FIG. 7.

Figure 8:
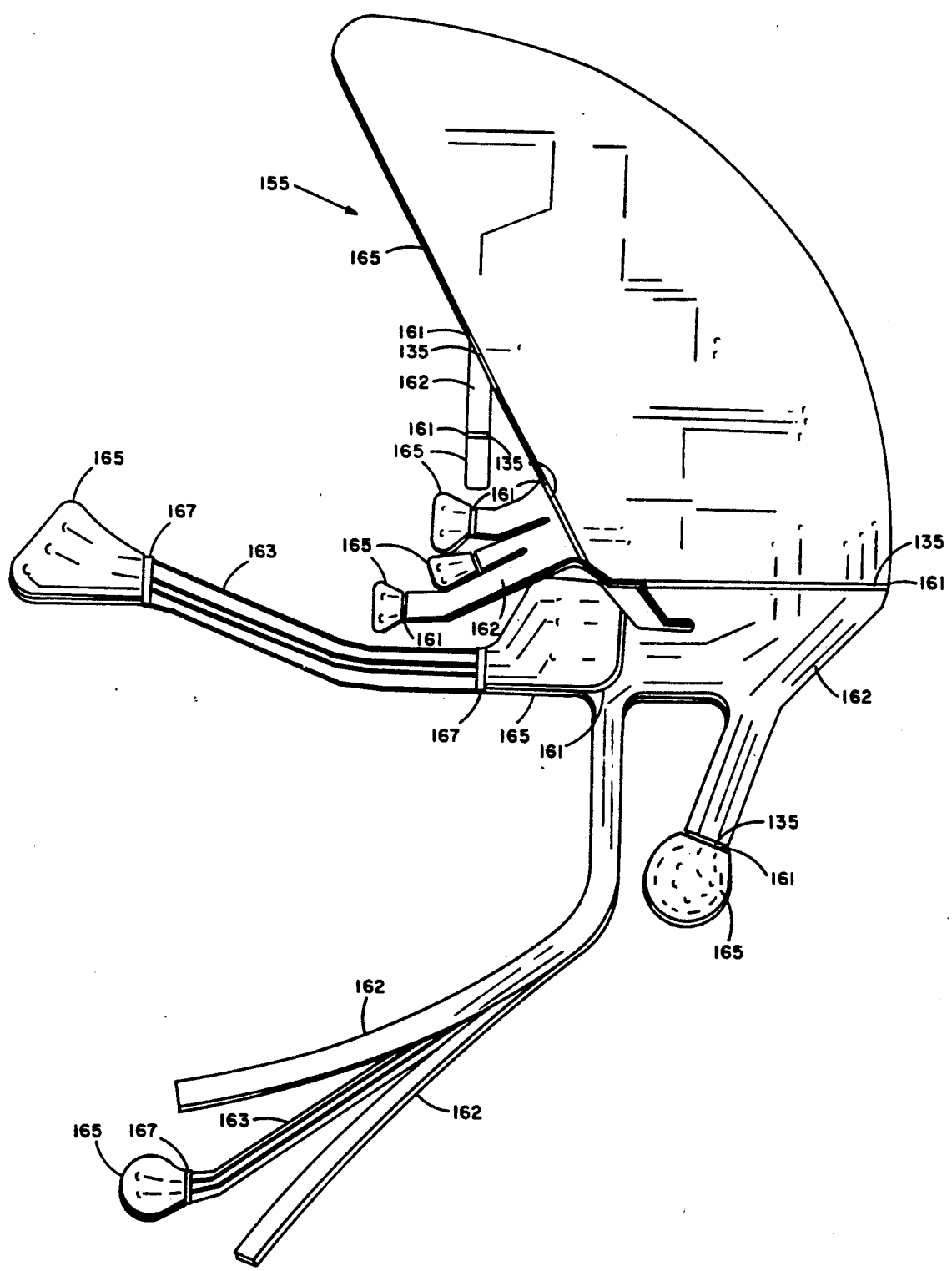
FIG. 8 illustrates a printed circuit according or constructed according to the present invention.

There is shown in FIG. 8 a printed circuit 155 including more flexible portions 163 and more rigid portions 165. Portions 165 are of the construction of FIG. 3. In producing a printed circuit 155 having flexible portions 163 as well as relatively rigid portions 165, a single sheet of board 123 is utilized as stiffener 51 for one side of all portions 165, and another, single sheet of board 125 is utilized to produce stiffener 53 for the other surface of all regions 165. In order to prevent bonding of such boards 123 and 125 to flexible layers 43 and 45 in portions 163, openings are provided in adhesive layers 137 and 145. After device 155 is cut out, and portion 162 of hard layer 123 is removed from flexible portions 163, residual portions 167 of layers 141 and 149 are left behind. The breadth of residual portions 167 can largely be determined by the width of slots 161. It is preferred that the corresponding edge of the openings in die-cut adhesive layers 137 and 145 be arranged so that that portion of residual portion 169 nearest the rigid portion 165 of device 155 is laminated to flexible portion 163, while the remainder 171 of residual portion 169 is left free to act much like a leaf spring to reduce stresses at the boundary between flexible portions 163 and more rigid portions 165. Laminated portion 169 also reduces stresses at such boundaries by acting as a fillet or stiffener at that boundary. Of a more transitional nature than stiffeners 51 and 53, increasing stiffness of that portion of the flexible portion 163 and providing added thickness to increase the radius of bend at the boundary.

Figure 9:
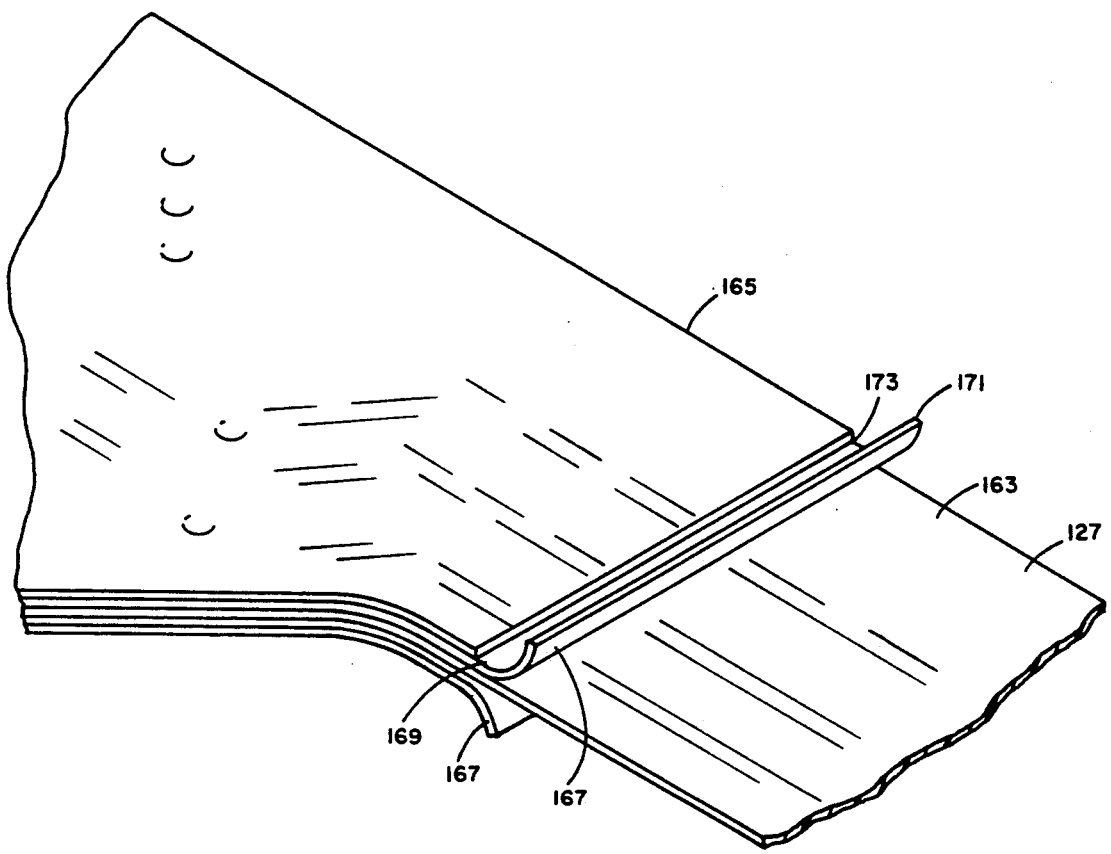
FIG. 9 is an enlarged view of a portion of the printed circuit of FIG. 8.

As shown in FIG. 9, a part 169 of portion 167 closest to more rigid portion 165 can be laminated to flexible portion 163, and the remainder 171 of residual portion 167 can be left free. Alternatively, all of residual portion 167 can be bonded to flexible portion 163, or can be left free. Bonding of all or part of residual portion 167 to flexible portion 163 tends to distribute stresses away from the adjacent boundary 173 between flexible portion 163 and more rigid portion 16. Leaving all or part of residual portion 167 free permits it to partially control bending of device 118 at boundary 173 in a manner similar to the functioning of a leaf spring.

It should be understood that the present invention can be utilized with other arrangements of layers than those shown. For example, one, two, three or any number of flexible and or rigid layers can be utilized as the interior layers. Although encapsulation is preferred, it is not required, such as where only one surface of a metallization-bearing layer is left blank or bare or of two adjacent surfaces of two adjacent layers. Metallization can be applied to both major surfaces of all layers, only to some surfaces, to some layers and not others, or not at all. The present invention should not be considered to be limited to the various numerical values set forth above. Residual portion can be fully bonded to the adjacent flexible layer surface for or to act much like a fillet, can be left free and unbonded to act much like a leaf-spring to limit stresses at the flexible/more rigid boundary or boundaries, or can be partially bonded and partially left free in different portions thereof. The various layers incorporated can all be flexible, or can include flexible layers and rigid layers. Datums can be other than holes. Other registration devices or markings can be utilized together with datums or in lieu of datums.

In summary, an internal, protective layer can be utilized to protect underlying circuitry during subsequent processing of exterior layers. Combination of such layer(s) with appropriately placed slots permits easier fabrication of a printed circuit having flexible portions and more rigid portions. Leaving residual portion(s) of such layer at a boundary between such portions provides stress relief for such boundary.

Some of the many advantages of the present invention should now be readily apparent. For example, a novel printed circuit and novel method of fabricating same have been provided which is capable of preventing or reducing contamination of interior layer(s) of the printed circuit while the printed circuit is fabricated. The printed circuit also is provided with structure for reducing stresses at boundaries between different portions of one such printed circuit, such as between portions of different flexibility or density. Furthermore, method and apparatus have thus been provided for easier production of a printed circuit which includes portions of different flexibility, particularly without the need for special inserts that must be specially fabricated for each individual application and which cannot be registered readily with other layers or connected to other layers without substantial potential for damaging same upon removal of such insert therefrom.

In summary, operation of the process of the invention is as follows. The flexible layers of circuitry are provided with conductive paths and other features as appropriate to produce two fully cover-coated insulated flexible layers. The outer layers which will act as a stiffener portion or the component mounting portion are similarly processed. The first in the outer layers is to put in the datums with the panels, print and etch only the inner layers of the panels. The flexible two-layer assembly of the center is processed exactly in the same way as the old method so that two fully cover-coated insulated flexible layers are created. The outer layers, which are to be the stiffeners, are printed and etched to form the circuitry on the surface which faces the flexible layers. The outer layers are then routed with small, narrow slots at the points of cutoff for the boundary or a future boundary of the flexible and more rigid portions of the final printed circuit product. A sheet of KAPTON polyimide coated with an acrylic adhesive is also cut out which is the same size as the basic panel. A sheet of adhesive is also die stamped in a pattern where the flexible layers are desired to protrude from the composite. The whole assembly is then laid up on a laminating fixture so that from the bottom up, a layer of stiffener board with the inner layers is then covered with an additional full sheet of KAPTON polyimide and acrylic, with the acrylic adhesive against the circuitry side. Over that is placed the die cut adhesive. Then the two-layer flexible circuit, then the die cut adhesive, then the KAPTON polyimide acrylic sheet again with the acrylic sheet, adhesive side up against the circuitry on the last layer of fiberglass which is laid down. This structure is then laminated together under heat and pressure. This technique now renders the product a totally sealed panel from all outside wet processing. The panel is then taken to the drill, wherein all holes are drilled as desired. This is followed by plasm etch and the usual technique of applying plated-through holes and the outer circuitry patterns through the photo-processes of print and etch. The panel is then hot tin reflowed and then taken to a router wherein the initial datums are reestablished and the outline of the part generated in order to cut the circuit loose. With the stiffeners in place with this system, no care has to be taken in routing as with the old pattern system. These circuits can then be taken and electrically tested for shorts and opens.

By using a bi-plastic film layer of e.g. KAPTON polyimide plus die cut film adhesive and building this into the circuit layup construction, the KAPTON polyimide base which is devoid of adhesive will not adhere to the adjacent substrate that it faces. After the basic part is stamped or routed from the panel, the unadhered KAPTON polyimide material can be trimmed to suit as to distance from the stiffener or rigidized board. The projecting film layer then acts much as a leaf spring and sharp corner stress reducer.

Use of a film layer or other protective layer keeps plating solution and etching solutions out of areas of circuit panels where their presence would mean entrapment of these fluids within the circuit panel structure, leading to subsequent corrosion or reduced electrical conduction or insulation within the circuit itself. The film layer is selectively sealed and adhered permanently to the circuit structure where desired and left unsealed by absence of adhesive in areas requiring flexibility.

Obviously, many modifications and variations of the present invention are possible in light of the above teachings. It is therefore to be understood that, within the scope of the appended claims, the invention may be practiced otherwise than as specifically described.

What is claimed is:

1. A multilayer printed circuit, comprising:
   first and second layers, each comprising substantially dielectric material, said second layer being more flexible than said first layer, said first layer having an opening therethrough for which said second layer does not have a corresponding opening therethrough, the opening defining a portion of a future boundary between more flexible and less flexible portions of said printed circuit in its final condition, wherein said second layer bears at least one conductive path; and
   disposed between and bonded to said first and second layers, a third layer comprising substantially chemically nonpermeable material for chemically isolating said at least one conductive path against damage as the result of subsequent treatment of said printed circuit.

2. A printed circuit as recited in claim 1 wherein said third layer comprising substantially chemically nonpermeable material is bonded to said first layer along an entire surface of said third layer facing said first layer and selectively bonded to said second layer.

3. A printed circuit as recited in claim 2 wherein said third layer comprising substantially chemically nonpermeable material comprises a layer of a polyimide material.

4. A printed circuit as recited in claim 3 wherein said polyimide material comprises a product of a polycondensation reaction between an aromatic diamine and an aromatic terabasic acid or an aromatic dianhydride.

5. A printed circuit as recited in claim 1 wherein said first layer includes metallic features on two opposite surfaces of said first layer.

6. A printed circuit as recited in claim 5 wherein said second layer comprises:
   a fourth layer comprising flexible material;
   a fifth layer comprising flexible material and bonded to said fourth layer and including at least one metallic feature on a surface of said fifth layer bonded to said fourth layer; and
   a sixth layer comprising flexible material and bonded to said fourth layer and bearing at least one metallic feature on a surface of said sixth layer bonded to said fourth layer.

7. A printed circuit, comprising:
a first layer comprising a first material;
a second layer comprising a second material more flexible than said first material, said second layer being bonded to said first layer along part of a surface of said second layer, such that respectively more and less flexible portions are formed with a first boundary defined therebetween; and
a first member, distinct from said first and second layers and more flexible than said less flexible portion, extending from the first boundary into said more flexible portion for ameliorating stress at the first boundary, wherein the portion of said first member extending from the first boundary into said more flexible portion is smaller than said more flexible portion.

8. A printed circuit as recited in claim 7 wherein said first member extends from between said first and second layers at the first boundary.

9. A printed circuit as recited in claim 8 wherein said first member comprises a resilient member.

10. A printed circuit as recited in claim 8 wherein said first member is connected to said more flexible portion along the entire facing surface of said first member.

11. A printed circuit as recited in claim 8 wherein said first member is connected to said more flexible portion along part of a surface of said first member facing said more flexible portion.

12. A printed circuit as recited in claim 8 wherein said first layer includes metallic features on two opposite surfaces of said first layer.

13. A printed circuit as recited in claim 8 wherein said second layer comprises:
a third layer comprising flexible material;
a fourth layer comprising flexible material and bonded to said third layer and including at least one metallic feature on a surface of said fourth layer bonded to said third layer; and
a fifth layer comprising flexible material and bonded to said third layer and bearing at least one metallic feature on a surface of said fifth layer bonded to said third layer.

14. A printed circuit as recited in claim 8 wherein said first member is connected to said second layer along an entire surface of said first member facing said second layer.

15. A printed circuit as recited in claim 8 wherein a portion of said first member is connected to said second layer along a part of a surface of said first member facing said second layer.

16. A printed circuit as recited in claim 8 wherein said first member comprises a polyimide material.

17. A printed circuit as recited in claim 16 wherein said polyimide material comprises the product of a polycondensation reaction between an aromatic diamine and an aromatic terabasic acid or an aromatic dianhydride.

18. A printed circuit as recited in claim 8 wherein:
said first material comprises a first dielectric material;
said first layer further comprises at least one conductive path disposed on said first dielectric material; and
said second material comprises a second dielectric material.

19. A printed circuit as recited in claim 8 wherein the portion of said first member extending from the first boundary into said more flexible portion is at least partially free of said more flexible portion.

20. A printed circuit as recited in claim 7, further comprising:
a third layer comprising a third material less flexible than said second material, said third layer being bonded to said second layer along part of a surface of said second layer, such that respectively more and less flexible portions of the printed circuit are formed with a second boundary defined therebetween; and
a second member extending from the second boundary into a more flexible portion for ameliorating stress at the second boundary.

21. A printed circuit as recited in claim 20 wherein the portion of said second member extending from the second boundary into said more flexible portion is smaller than said more flexible portion.

22. A printed circuit as recited in claim 20 wherein:
said first member extends from between said first and second layers at the first boundary; and
said second member extends from between said second and third layers at the second boundary.

23. A printed circuit, comprising:
a first layer of a first material;
a second layer of a second material more flexible than said first material, said second layer being bonded to said first layer along part of a surface of said second layer, such that respectively more and less flexible portions are formed with a first boundary defined therebetween; and
a first member distinct from said first and second layers and composed of a third material more flexible than said first material, extending from the first boundary into said more flexible portion for ameliorating stress at the first boundary, wherein the portion of said first member extending from the first boundary into said more flexible portion is smaller than said more flexible portion and is at least partially free of said more flexible portion.

24. A printed circuit as recited in claim 23, further comprising:
a third layer comprising a third material less flexible than said second material, said third layer being bonded to said second layer along part of a surface of said second layer, such that respectively more and less flexible portions of the printed circuit are formed with a second boundary defined therebetween; and
a second member extending from the second boundary into a more flexible portion for ameliorating stress at the second boundary.

25. A printed circuit as recited in claim 24 wherein:
said first member extends from between said first and second layers at the first boundary; and
said second member extends from between said second and third layers at the second boundary.

26. A printed circuit as recited in claim 23 wherein said first member extends from between said first and second layers at the first boundary.

27. A printed circuit as recited in claim 26 wherein said first member comprises a resilient member.

28. A printed circuit as recited in claim 26 wherein said first layer includes metallic features on two opposite surfaces of said first layer.

29. A printed circuit as recited in claim 26 wherein said second layer comprises:
a third layer comprising flexible material;

a fourth layer comprising flexible material and bonded to said third layer and including at least one metallic feature on a surface of said fourth layer bonded to said third layer; and a fifth layer comprising flexible material and bonded to said third layer and bearing at least one metallic feature on a surface of said fifth layer bonded to said third layer.

30. A printed circuit as recited in claim 26 wherein:

said first material comprises a first dielectric material;

said first layer further comprises at least one conductive path disposed on said first dielectric material; and said second material comprises a second dielectric material.

31. A multilayer printed circuit, comprising:

first and second layers, each comprising substantially dielectric material, said first layer having an opening therethrough for which said second layer does not have a corresponding opening therethrough, the opening defining a portion of a future boundary between more flexible and less flexible portions of said printed circuit in its final condition, wherein said second layer bears at least one conductive path and said second layer is more flexible than said first layer;

disposed between and bonded to said first and second layers, a third layer comprising substantially chemically nonpermeable material for chemically isolating said at least one conductive path against damage as the result of subsequent treatment of said printed circuit;

a fourth layer comprising substantially dielectric material and less flexible than said second layer, said fourth layer having an opening therethrough for which said second layer does not have a corresponding opening therethrough, the opening defining a portion of a future boundary between more flexible and less flexible portions of said printed circuit in its final condition; and disposed between and bonded to said second and fourth layers, a fifth layer comprising substantially chemically nonpermeable material for chemically isolating said at least one conductive path against damage as the result of subsequent treatment of said printed circuit.

32. A printed circuit as recited in claim 31 wherein said third layer comprising substantially chemically nonpermeable material is bonded to said first layer and selectively bonded to said second layer.

33. A printed circuit as recited in claim 32 wherein:

said first layer is substantially rigid;

said second layer is substantially flexible; and said third layer is substantially rigid.

34. A printed circuit as recited in claim 32 wherein said first layer includes metallic features on two opposite surfaces of said first layer.

35. A printed circuit as recited in claim 34 wherein said second layer comprises:

a fourth layer comprising flexible material;

a fifth layer comprising flexible material and bonded to said fourth layer and including at least one metallic feature on a surface of said fifth layer bonded to said fourth layer; and a sixth layer comprising flexible material and bonded to said fourth layer and bearing at least one metallic feature on a surface of said sixth layer bonded to said fourth layer.

36. A multilayer material, comprising:

a first layer comprising a first material;

a second layer comprising a second material more flexible than said first material, said second layer being bonded to said first layer along part of a surface of said second layer, such that respectively more and less flexible portions of the multilayer material are formed with a first boundary defined therebetween; and a first member distinct from said first and second layers extending from between said first and second layers at the first boundary into said more flexible portion for ameliorating boundary stress, wherein the portion of said first member extending from the first boundary into said more flexible portion is smaller than said more flexible portion.

* * * * *